(12) United States Patent
Stadelmann

(10) Patent No.: US 7,250,708 B2
(45) Date of Patent: Jul. 31, 2007

(54) ELECTRIC SWITCH, ESPECIALLY A PIEZO SWITCH, WITH OPTICAL AND/OR MECHANICAL FEEDBACK OF THE SWITCHING OPERATION

(75) Inventor: Mathias Stadelmann, Heimenkirch (DE)

(73) Assignee: DYNA Systems GmbH, Lindenberg (DE)

( * ) Notice: Subject to any disclaimer, the term of this patent is extended or adjusted under 35 U.S.C. 154(b) by 525 days.

(21) Appl. No.: 10/415,967

(22) PCT Filed: Nov. 2, 2001

(86) PCT No.: PCT/EP01/12690

§ 371 (c)(1),
(2), (4) Date: Oct. 24, 2003

(87) PCT Pub. No.: WO02/37516

PCT Pub. Date: May 10, 2002

(65) Prior Publication Data

US 2004/0075360 A1    Apr. 22, 2004

(30) Foreign Application Priority Data

Nov. 6, 2000  (DE) ............................... 100 54 862

(51) Int. Cl.
*H01L 41/08* (2006.01)
(52) U.S. Cl. ...................................... 310/339; 200/181
(58) Field of Classification Search ................ 310/339, 310/338, 330, 324, 340, 328; 341/34; 200/181
See application file for complete search history.

(56) References Cited

U.S. PATENT DOCUMENTS

| | | | | |
|---|---|---|---|---|
| 3,339,104 A | * | 8/1967 | Kushner et al. | 315/55 |
| 3,935,485 A | * | 1/1976 | Yoshida et al. | 310/339 |
| 4,158,117 A | * | 6/1979 | Quilliam et al. | 200/181 |
| 4,430,595 A | | 2/1984 | Nakasone et al. | |
| 4,516,112 A | * | 5/1985 | Chen | 341/34 |
| 4,521,712 A | * | 6/1985 | Braun et al. | 310/339 |
| 5,349,263 A | * | 9/1994 | Katayama et al. | 310/338 |
| 5,442,150 A | * | 8/1995 | Ipcinski | 200/181 |
| 5,636,729 A | * | 6/1997 | Wiciel | 200/181 |
| 5,770,914 A | * | 6/1998 | Pease et al. | 310/339 |
| 5,883,459 A | * | 3/1999 | Cline et al. | 310/339 |
| 6,064,141 A | * | 5/2000 | Wiciel | 310/339 |
| 6,310,428 B1 | * | 10/2001 | Pulli et al. | 310/339 |

FOREIGN PATENT DOCUMENTS

DE  31 33 134 A1  8/1981

(Continued)

*Primary Examiner*—Mark Budd
(74) *Attorney, Agent, or Firm*—Lackenbach Siegel, LLP; Myron Greenspan

(57) ABSTRACT

The invention relates to an electric switch, especially a piezo switch, with optical and/or mechanical feedback of the switching operation. The switch contains at least one switching element, especially beneath a cover panel, which can be activated by means of an activating element. This causes a switching signal to be generated and guided out via electrical contacts. The activating element itself is configured in the form of a passive luminous body consisting of an at least translucent material, which can be illuminated by active luminous means. The mechanical feedback of the switching operation can take place using a vibrator which is activated by the switching operation that has been initiated and conveys a vibrating motion to the luminous body.

44 Claims, 6 Drawing Sheets

FOREIGN PATENT DOCUMENTS

| | | |
|---|---|---|
| DE | 37 13 528 C2 | 4/1987 |
| DE | 91 05 230 U | 4/1991 |
| DE | 42 15 943 A1 | 5/1992 |
| DE | 93 12 587 U | 8/1993 |
| DE | 295 10 010 U | 6/1995 |
| DE | 195 28 821 A | 8/1995 |
| DE | 197 04 253 A1 | 2/1997 |
| EP | 0 538 199 A | 10/1992 |
| JP | 05 250 955 | 9/1993 |
| JP | 00 123 678 A | 4/2000 |

* cited by examiner

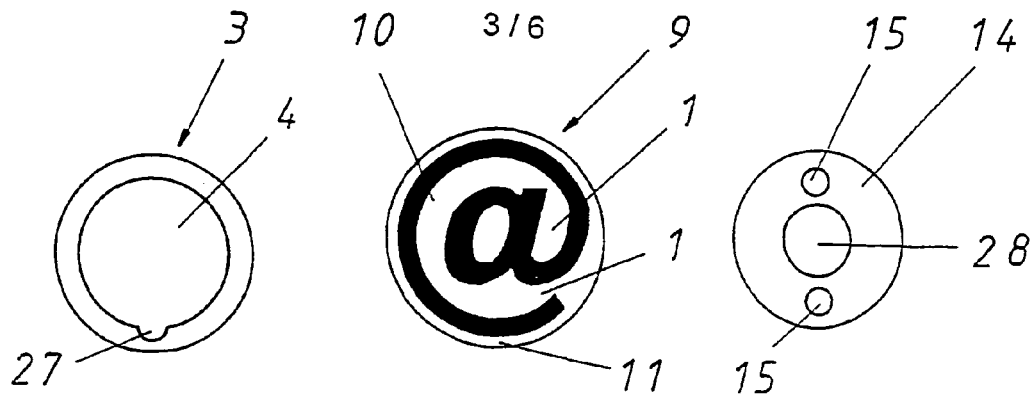
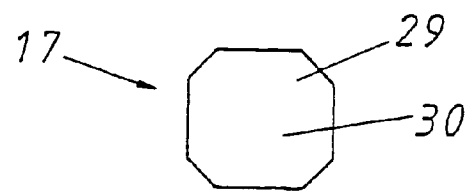
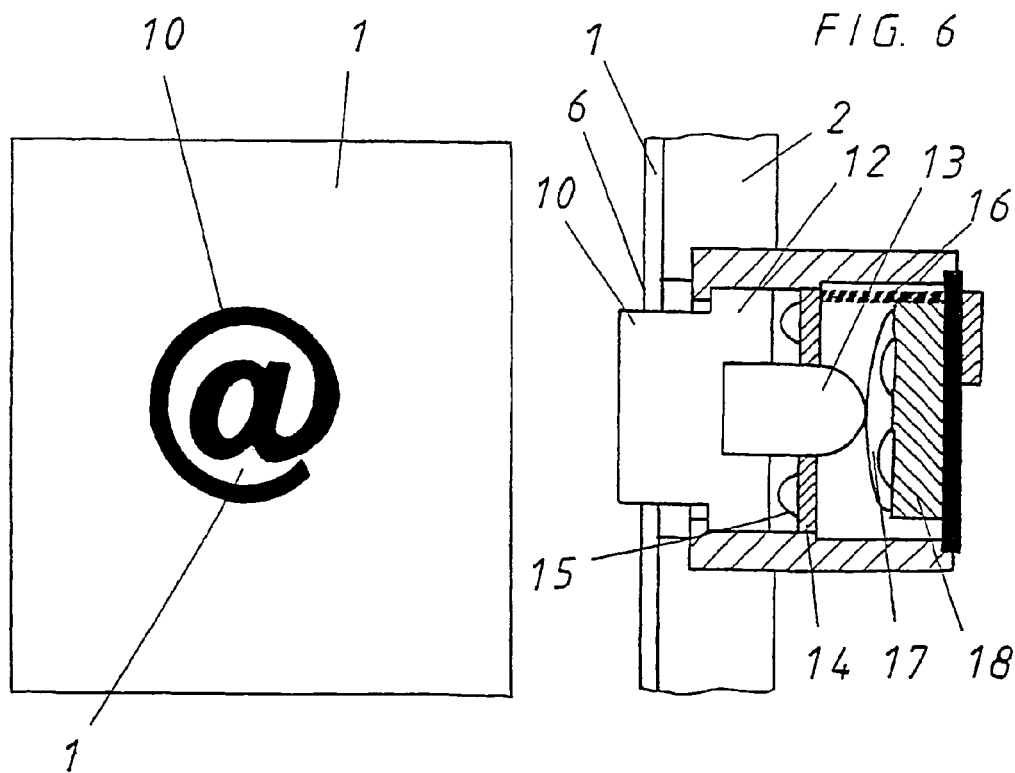
FIG. 3    FIG. 4    FIG. 5
FIG. 6
FIG. 8    FIG. 7

ELECTRIC SWITCH, ESPECIALLY A PIEZO SWITCH, WITH OPTICAL AND/OR MECHANICAL FEEDBACK OF THE SWITCHING OPERATION

BACKGROUND OF THE INVENTION

1. Field of the Invention

The invention relates to an electric switch, in particular a piezo switch, with optical and/or mechanical feedback of the switching operation. The invention is expressly, but not exclusively, related to piezo switches, but all functional principles of an electric switch are to be covered by the invention and consequently will be protected. In the following paragraphs, reference is only made to the preferred application of a piezo switch.

2. Description of the Prior Art

Such a piezo switch is disclosed for example in the subject matter of U.S. Pat. No. 4,430,595, in which in an approximately cubical housing a piezo element is disposed, which is actuated from above by an actuator, which with its actuation face extends through a cutout in a formed cover part. As the actuation face is provided a round, relatively flat face and the entire actuator is not illuminated.

DE 197 04 253 A1 disclosed an operating unit for motor vehicle components with a movable operating element, at whose front wall section an at least partially translucent symbol field is disposed, and a light guide element is disposed under the front wall section of the operating element which acts onto a switching member of the switch for the purpose of its actuation if the operating element is moved downwardly. The symbol field is directly illuminated by a light element via the light guide element, with the light element being disposed beneath the light guide element. The light guide element has an oblique surface for the incidence of light, which permits the off-center position of the light element due to the central position of the switch.

Of disadvantage herein is that for the actuation of the switch several different elements expensive of production and at least partially transparent (operating element with symbol field and light guide element with oblique surface) must be provided, which leads to increased material and assembly costs as well as also to a lower light yield through light absorption, in particular at the transitions of the different elements. An optical and/or mechanical feedback for the switching operation is not disclosed in DE 197 04 253 A1.

The invention is based on the task of developing further a switch, in particular a piezoelectric switch, of the above described type such that an optical and/or mechanical feedback of the switching operation takes place in an especially noticeable manner.

An essential characteristic of the invention is that the actuation element itself is developed as a passive luminous body of an at least translucent material, with the passive luminous body being illuminated via active illuminating means.

With the provided technical teaching the significant advantage is obtained that now the actuator of the in particular piezoelectric switch overall is formed as a luminous body, which is preferably comprised of a translucent synthetic material.

Such a synthetic material should thus be developed at least as a partially translucent material, but it can also be formed to be completely transparent.

This can involve here a single-layer or a multi-layer luminous body, such that with its back side illumination, the light overall is uniformly distributed in the luminous body developed as an actuator.

If the actuation surface (i.e. the face of the switch close to the user and to be pressed) is developed as a symbol field, the symbol body is especially intensely luminous. An especially impressive luminous phenomenon is obtained if the symbol body is three-dimensionally milled out of the front face of the luminous body, such that it is only necessary to press the symbol body in order to actuate the luminous body developed as an actuator, which, in turn, actuates the switching element in the switch.

This yields for the first time the advantage that no actuation housing for a luminous body is necessary, as is for example taught in DE 31 33 134 A1.

In it, the precondition is that in an approximately bulb-form opaque housing at the front side a translucent synthetic pane is inserted, which is back-illuminated by one or several LEDs.

This necessitates a structure requiring extensive space and yields an unimpressive illumination of the actuation face since the actuation face is relatively small.

SUMMARY OF THE INVENTION

This is the point at which the invention comes into play, which provides that overall the actuation body is developed as a luminous body, at whose front side the symbol body is preferable milled out as a threedimensional body.

This three dimensional development of the symbol body of the luminous body can be realized in two different embodiments.

First, in the first embodiment the opening in the cover plate, through which extends the luminous body, can be completely cut through such that the threedimensional symbol body, together with the remaining portions of the luminous body, extends fully all over through, for example, a cylindrical opening in the cover plate.

In this case the symbol body is illuminated as well as also its surrounding area in the luminous body itself.

In a different, second embodiment, it can be provided that only the symbol body extends through a correspondingly form-fittingly adapted opening in the cover plate and that the remaining portions of the luminous body are covered by the webs of the milling-out and opening in the cover plate are covered, such that in this case only the threedimensional symbol body itself projects through the openings in the cover plate and only the symbol body itself in this case also appears to be illuminated from the outside.

In the first case, thus overall the front facing of the luminous body with the symbol body formed thereon is illuminated while in the second case only the symbol body itself extends as an illuminated element through the corresponding openings in the cover plate and thus acts simultaneously as an actuation element.

This second embodiment is especially preferred within the scope of the present invention and herewith an impressively illuminated switch is obtained.

Since only the three dimensionally milled-out symbol body is visible from the front of the cover plate, this symbol body serves simultaneously as an actuation surface for the switch. This symbol body is illuminated according to the invention. This yields the advantage that, apart from the optically impressive appearance of the actuation surface, which is only characterized by the symbol body itself, simultaneously also locating by feeling the symbol body (without visual aid) is possible.

In the manner of a Braille symbol with a switch illuminated in such manner several illuminated Braille symbols can be accommodated, which thus are very well detectable by touch as actuating surface and are actuable through the corresponding push of a finger.

For the tactile feedback of the actuation of the luminous body different embodiments are available, which are all encompassed by the inventive concept of the present invention. These embodiments are each to enjoy protection by itself but also in combination with one another.

The first embodiment provides that the luminous body developed as an actuation element acts onto a catch spring and the catch spring, in turn, is seated on the piezo element such that, upon actuation of the symbol body, first the luminous body is moved by a switching path of, for example, 0.3 mm into the housing of the switch until the piezo element is actuated by the catch spring and outputs the corresponding signal.

A second embodiment of the invention provides that such a catch spring is omitted and that, instead, the actuation element (developed as a solid material luminous body) sits directly on the piezo sensor. In this case no tactile feedback of the switching operation to the user takes place since the luminous body needs only be moved by a switching path of for example 4 μm in order to generate a corresponding electric signal at the piezo sensor.

However, in all switch variants an optical feedback can take place, for example in such manner that the illumination onto the symbol body is changed for a different color or is switched on or off.

Important in all embodiments is thus the all-around illumination of the luminous body, which itself is developed as an actuation element.

For this purpose, on the backside of the luminous body—in the interior volume of the switch housing—several LEDs are disposed distributed on the circumference, and LEDs of a single color are preferably used which illuminate the backside of the luminous body fully.

Due to the illumination distribution in the luminous body, it is consequently illuminated uniformly over its entire volume and the luminance is transferred highly uniformly onto the symbol body disposed on the front side.

It is understood that it is also possible to provide differently colored LEDs in order to generate, for example, during one switching operation a green color of the luminous body as the illumination color and, when the switching operation is changed, to switch on the blue or green LEDs to allow the luminous body to light up in this case in said color.

In a third embodiment of the present invention a motor-driven feedback of the switching operation to the user is provided.

For this case it is provided that on the switch housing or in the switch housing a vibrator is disposed which, due to the initiated switching operation, is actuated and which outputs a vibrating movement onto the luminous body (and therewith to the actuator) such that the actuator mechanically vibrates when the switching operation is triggered.

For the development of this vibrator there are a number of feasibilities which are all encompassed by the invention.

A first embodiment provides that the vibrator is developed as a miniature motor, which drives a disk on which is disposed an eccentrically supported eccenter weight.

With the switching-on of this motor therewith the eccenter weight on the disk will generate a corresponding imbalance and this imbalance is transferred via the motor support and the motor mounting bracket of the motor on the housing of the switch onto the luminous body developed as an actuator.

It is understood that in a different embodiment the eccenter weight can be omitted and in this case the eccentrically supported disk itself forms the imbalance.

A different embodiment of the invention can provide that the vibrator is developed as a hammer break, i.e. in the manner of a bell, while alternately two different contacts are switched which also vibrate and also transfer this vibration movement to the luminous body.

An electromagnet or an ultrasound element can, of course, also be employed, which can output a corresponding vibration, also in the range of human perception.

A third embodiment can provide that the piezo sensor is also used as an active vibration element. In this case the piezo crystal is made to vibrate through a switched voltage applied from the outside, and these vibrations are directly transmitted to the luminous body since it is seated with a corresponding actuation extension directly, or via the spring washer indirectly, on the piezo crystal.

A second piezo element can equally well be employed, which is connected force-fittingly with the luminous body, which, only when the switching operation is switched on for a length of, for example 120 ms, exerts said vibration movement onto the luminous body.

It is understood that the feedback of the switching operation via said vibrators also functions independently of the previously cited illumination.

In other words, the protective scope of the present invention thus relates also to a switch with a non-illuminated luminous body, at whose housing a vibrator is disposed, which, during the triggering of the switching operation, exerts for a specific time of, for example, 120 ms, a tactile feedback in the form of a vibration onto the actuator.

BRIEF DESCRIPTION OF THE DRAWINGS

In the following the invention will be explained in further detail in conjunction with several drawings which represent several embodiment feasibilities. Based on the drawing and its description, further characteristics and advantages of the invention are evident.

Therein depict.

DESCRIPTION OF THE PREFERRED EMBODIMENTS

Figure 1:
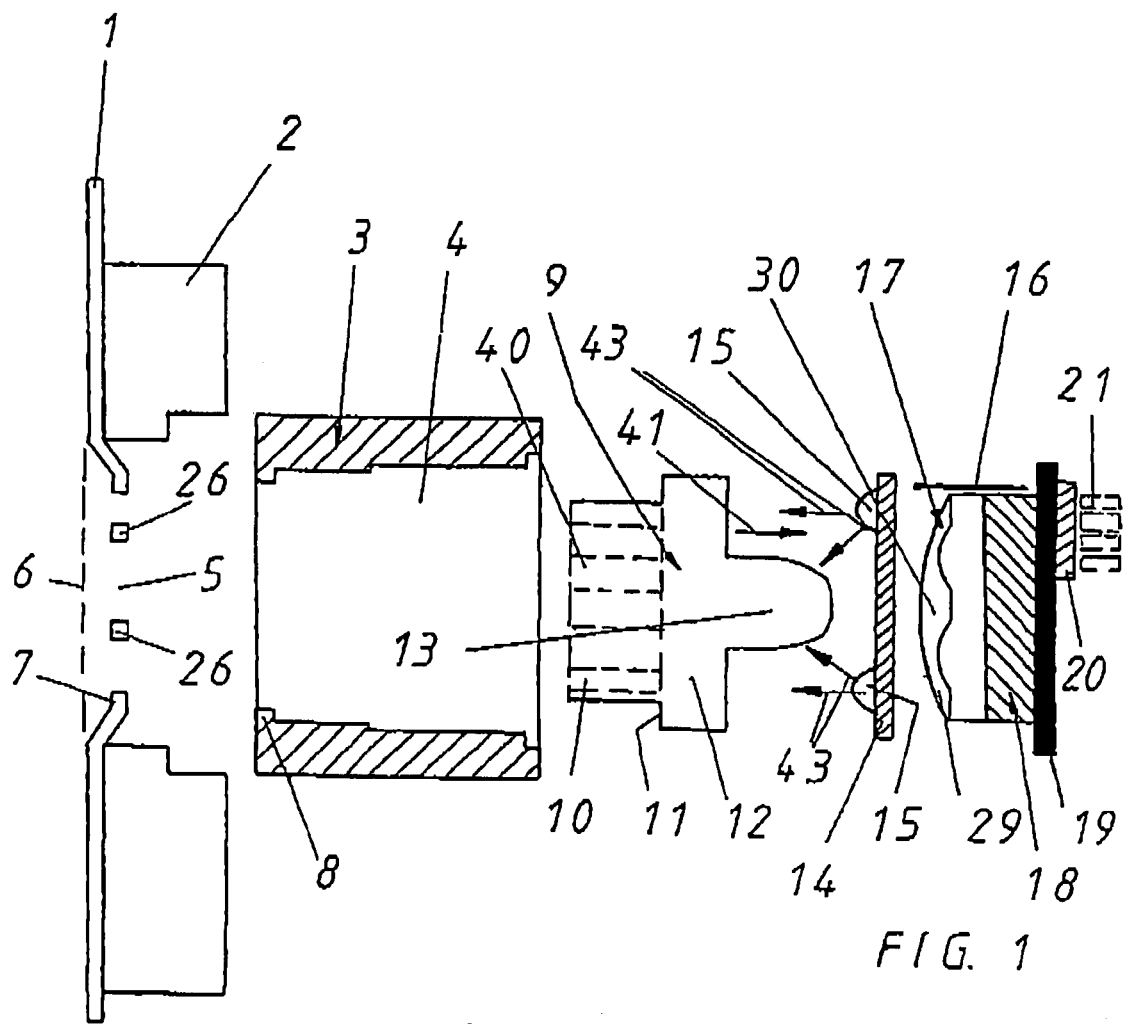
FIG. 1 schematically an exploded view in section of a first embodiment of a piezo switch.

The piezo switch according to the invention according to FIG. 1 resides behind a cover plate 1, which can be formed of any desired material, for example of wood, metal, glass or synthetic material. The cover plate 1 can be formed in any desired manner.

For the mechanical stabilization of the cover plate it can be backed with a support 2 which is comprised for example of a synthetic material. The support 2 can herein be adhered on the cover plate 1. But it can also be connected with the cover plate 1 integrally with the material.

The support 2 can also be clamped mechanically on the cover plate 1, with corresponding clamp brackets being available which are not further shown.

In the cover plate 1 a cutout 5 is disposed, with the cutout 5 being offset back from the fronting side front face 6 and forming a back-offset 7.

On support 2 is fastened the housing 3 of a piezo switch and it is possible to employ any fastening means. The housing can herein be clamped, adhered, screwed or be connected in any manner fixedly or detachably to the support 2.

The housing 3 is comprised essentially of a hollow cylinder, which has an inner cylindrical hollow volume 4, comprising several steps.

In the proximity of the anterior front side an annular stop 8 is developed, which serves for the movement stop of the luminous body 9 developed as an actuation element. With respect to the embodiment example described here, but also with respect to all other embodiment examples, it will be noted in general in conjunction with FIGS. 1 to 12 that the forming of the overall switch can be varied within a wide range. While the embodiment examples show that the elements of the switch (housing 3, luminous body 9 and all other parts, such as, for example, the circuit boards 14 and 19) are developed as circular parts, however, the invention is not limited to this. The listed parts can also be formed in other cross-sectional forms such as, for example, elliptical, triangularly, hexagonally, octagonally, square and the like.

The representation of the listed parts as cylindrical parts, circular in cross section, is therefore to be only understood as an example.

It is important that the luminous body 9 is now developed as an actuation element, for example of a translucent synthetic material, and comprises a front symbol body 10, which is formed threedimensionally.

The shaping takes place in such manner that only the symbol webs 40 defining the shaping of the symbol extend through the corresponding openings in the region of the cutout 5 of cover plate 1 and the remaining portions of the symbol body are covered by the webs 26 of the cover plate 1 disposed in the region of the cutout 5.

This leads to an optical impression such that only the threedimensional symbol body 10 extends through the corresponding cutout 5, such as is for example depicted in FIGS. 4 and 8.

Upon pressure onto this symbol body 10 the luminous body 9 is actuated in the direction of arrow 41.

The symbol body 10 is preferably integrally with the material milled out of the material of the luminous body 9. It is, of course, also possible to develop the symbol body 10 as a separate element from the luminous body 9 and to adhere, spray or fasten it in any other way on the remaining parts of the luminous body 9.

The symbol body 10 is thus milled out in the axial direction with corresponding webs 40 down to the base of the annular shoulder 11, with the annular shoulder 11 having an increased diameter and defining a circular cylindrical extension 12.

This circular cylindrical extension 12 with the anterior annular shoulder 11 abuts on the annular stop 8 in housing 3.

According to FIG. 1 adjoining the extension 12 of enlarged diameter is a pressure piece 13 of decreased diameter, which extends through a corresponding cut-through 28 in circuit board 14 and is seated on an arched bottom 30 of a catch spring 17, which, in turn, rests by means of extensions 29 developed at the cornered side on the peripheral margins of the piezo sensor 18.

Consequently, if the symbol body 10 is actuated by a corresponding actuation force, it moves in the direction of arrow 41 in the direction toward the catch spring 17, presses its arched bottom 30 through, such that with its arched bottom 30 it is in contact approximately in the center region on the piezo sensor 18 and switches it, which piezo sensor 18 will be described in further detail in FIG. 2.

Figure 2:
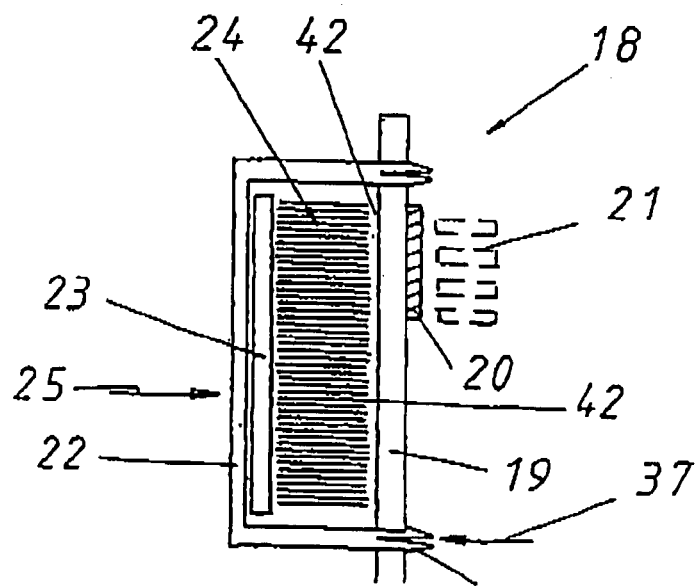

According to FIG. 2 on a support plate 19 a guide rubber 24 is disposed, which bears on its anterior side a piezo crystal 23.

The entire configuration is covered by a pot-form synthetic cap 22, which extends by means of pins 38 into associated cut-throughs of the support plate 19 and is anchored there.

Upon pressure of the catch spring 17 in the actuation direction 25 onto the synthetic cap 22, consequently the piezo crystal 23 is compressed and outputs via the guide rubber 24 a corresponding piezo voltage onto the contact surfaces 42 disposed on the circuit board 19.

On the circuit board 19, additionally, associated evaluation circuits are disposed which amplify the piezo switching signal correspondingly and convert it into a corresponding evaluatable signal. This is conducted via the plug affixed on the circuit board 19 to the outside, which is comprised of the plug body 20 and the plug pins 21 attached thereon.

According to FIG. 1 it is provided that on the circuit board 14 an illumination is disposed which, in the depicted embodiment example, is comprised of two diametrically opposing LEDs 15, which are connected via a connection line 16 to the support plate 19.

It is important that the LEDs 15 distribute their light in the direction of arrow 43 onto the entire back side of the luminous body 9, such that the light acts onto the pressure piece 13 as well as also onto the annular extension 12, such that the luminous body 9 overall is illuminated from the back over the entire surface and, in the sense of a light guide, conducts the light further highly uniformly distributed over the symbol body 10.

Figure 1A:
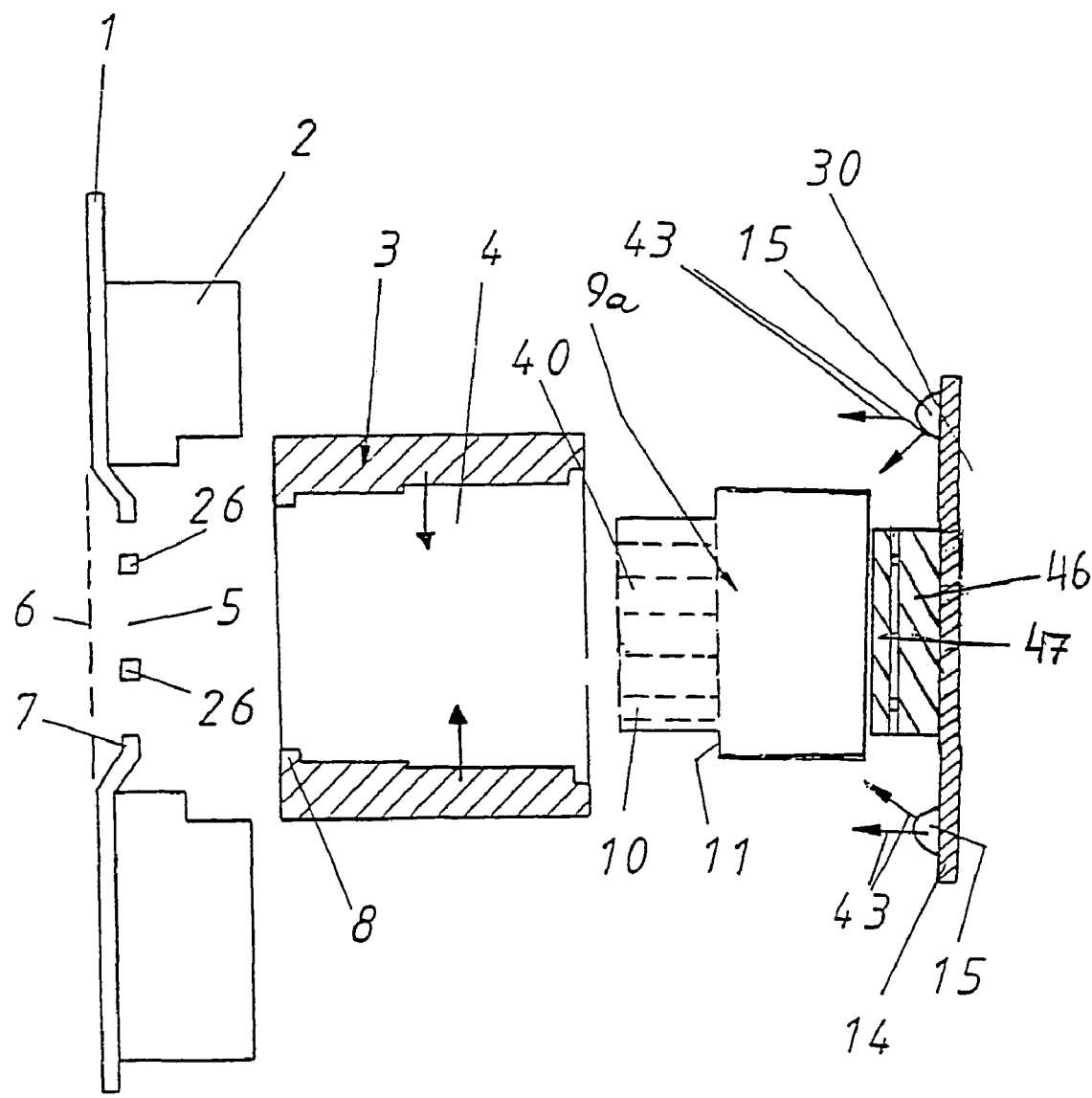
FIG. 1a: schematically an exploded view in section of a further embodiment of a piezo switch without pressure piece of the actuation element, FIG. 2 an enlarged representation of the piezo sensor according to FIG. 1, FIG. 3 view onto the front side of the housing of the switch, FIG. 4 view onto the front side of the symbol body penetrating the cut-through in the cover plate, FIG. 5 view onto the circuit board with the LEDs according to FIG. 1, FIG. 6 view onto the catch spring according to FIG. 1, FIG. 7 embodiment according to FIG. 1 in the assembled state with a minor modification in the region of the cover plate, FIG. 8 view onto the front side of the embodiment according to FIG. 7, FIG. 9 an embodiment modified relative to FIG. 7 with a minor modification in the region of the cover plate and with the catch spring omitted, FIG. 10 view onto the front side of the configuration according to FIG. 9, FIG. 11 schematic section through a further embodiment, modified relative to FIG. 7, with a minor modification in the region of the cover plate and with mechanical feedback of the switching operation, FIG. 12 view onto the front side of the embodiment according to FIG. 11, FIG. 13 the switch according to FIG. 11 with a different embodiment of the vibrator and the mounting bracket of the vibrator on the motor support, and FIG. 14 the vibrator according to FIG. 13 in side view.

In FIG. 1a is schematically shown an exploded view in section of a further embodiment of a piezo switch, which, without finger-form pressure piece 13 of the luminous body 9, operates as shown in FIG. 1.

The core of this embodiment according to FIG. 1a is that the luminous body 9a is developed approximately roller-form and not disk-form with pin-form extension 13 as in the embodiment according to FIG. 1. Thus, in other words, according to the embodiment of the switch of FIG. 1, the finger-form pressure piece 13 of the luminous body 9 is now omitted and the new luminous body 9a itself actuates as a cylinder body (without interplacing such a pressure piece) via an actuation plate 47 the switching element 46 disposed beneath or behind, which switching element can be a piezo sensor.

The switching element 46 can be disposed directly on the circuit board 14, which also supports the LEDs 15, whereby considerable installation space in the depth dimension is saved. The switch according to FIG. 1a thus requires a significantly smaller structural depth than the switch according to FIG. 1, which is especially of advantage when installing into instrument panels in the field of motor vehicles.

The emitted light of the LEDs 15 disposed horizontally with respect to the light guide element (upright LEDs or those of type 90) is subsequently also conducted essentially horizontally into the light guide element. With considerably lower structural height of the switch, hereby a very good light distribution in the light guide element is attained. In comparison to the embodiment according to FIG. 1 and according to prior art, the LEDs 15 are thus disposed no longer beneath the luminous body. Due to the flat structure of the electric switching element, the light of the LEDs 15, upright or developed as 90 types, is conducted horizontally laterally, into the luminous body, which leads to an ideal light distribution at simultaneously minimal structural height.

The structural parts provided in FIG. 1 and 1a with identical reference symbols denote identical structural parts and will therefore not be described here.

In FIGS. 3 to 6 the details of different parts are shown in view. FIG. 3 shows the front view of housing 3, and it is evident that on the housing additionally an axially extending groove 27 is worked in, such that the connection lines 16 can be carried axially along in the housing.

FIG. 4 shows that the symbol body 10 can be developed for example as an "@". Thus this symbol body 10 is only visible from the front (from the viewing side of the cover plate 1) and lights up intensely. It is simultaneously the actuation element since only onto this symbol body the actuation force onto the luminous body 9 is conducted.

This yields a completely novel actuation and a completely novel appearance of such a switch since now through the pressure onto a specific symbol a switch is actuated, which previously was not known.

It is understood that the invention is not limited thereto. It can also be provided that the webs 26 in the region of the cutout 5 are omitted, such that the symbol body 10 with its symbol base in the region of the annular shoulder 11 is visible so that the projecting symbol lights up more strongly than the receding symbol base which sits approximately at the level of the annular shoulder 11.

In a third embodiment it can be provided that the symbol body 10 is not milled out of the solid material of the luminous body 9 but rather that a symbol is adhered onto the front side of the luminous body and in this case only the environment of the symbols lights up.

However, the embodiment listed first is viewed as the preferred embodiment. Instead of adhering a flat symbol, it is also possible to adhere symbol bodies which are either also developed flat or as threedimensional bodies. Instead of adhering them, other connection mechanisms can also be chosen, such as for example spraying on and/or mechanical locking and the like.

Through the cut-through 28 depicted in FIG. 5 in the circuit board 14 extends the pressure piece 13 of the luminous body 9 and subsequently rests on the catch spring 17.

FIG. 6 shows this catch spring 17, and it is evident that an approximately square metal platelet has corner-side oblique notching and consequently forms extensions with which the catch spring 17 in the margin regions of the synthetic cap 22 rests on it.

The catch spring 17 can be held in any desired manner in the interspace between the synthetic cap 22 and the circuit board 14.

FIG. 7 shows the assembled state of the configuration according to FIG. 1, wherein it is only additionally shown that the back-offset 7 in the region of the cover plate 1 can be omitted, such that the symbol body 10 projects beyond the front face 6 of the cover plate 1, while in FIG. 1 it is flush with the front face 6 or recedes behind the front face 6. The embodiment according to FIG. 1 would yield a deeper formed encircling edge, as is shown in FIG. 10.

In FIG. 8 this edge is omitted, since the FIG. 8 is the front view of the representation according to FIG. 7 and it can be seen that only the symbol body 10 extends out through corresponding openings in the cover plate and is hereby directly actuated.

However, the front edge of the symbol body 10 must always—even if only slightly—project beyond the front edge of the cutout 5 in order to ensure at all a—slight—actuation tolerance for the luminous body 9.

Figure 9:
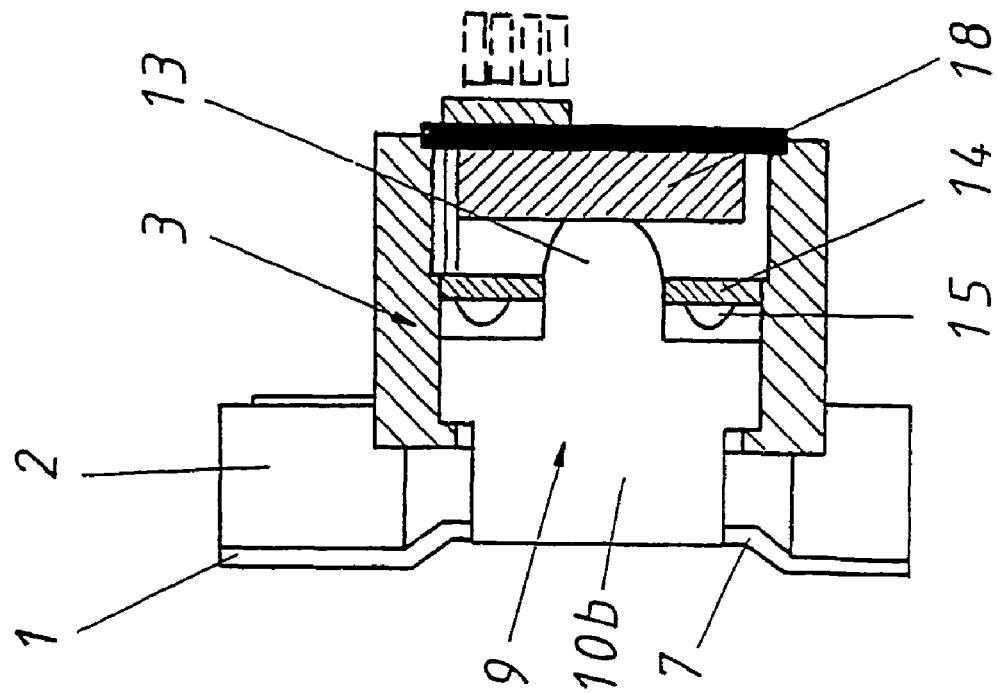
Figure 10:
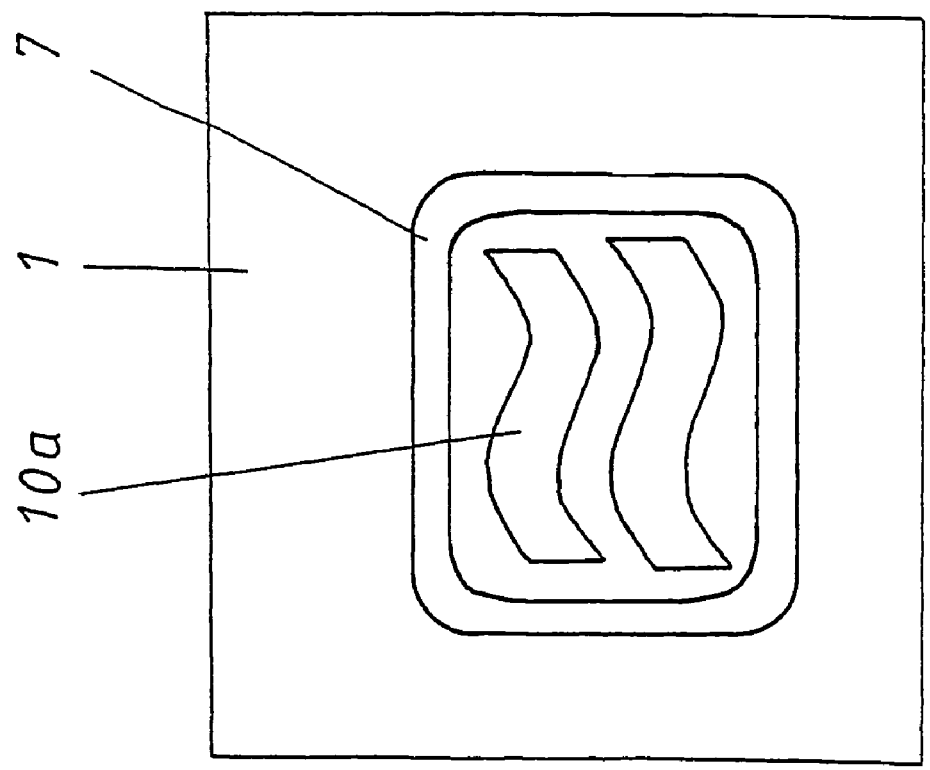

FIGS. 9 and 10 show that the catch spring 17 can be omitted so that the pressure piece 13 rests directly on the piezo sensor 18.

It is also shown that when applying an offset 7, an encircling edge in the region of the cover plate 1 is formed in whose interior region now the three-dimensional symbol body 10 projects from corresponding openings of the cutout 5 and is intensely and noticeably illuminated.

The encompassing region of the wave-form symbol body 10a according to FIG. 10 is not illuminated and is formed of the material of the cover plate such that only this wave-form symbol itself lights up noticeably and serves as an actuation element for the luminous body 9.

Figure 11:
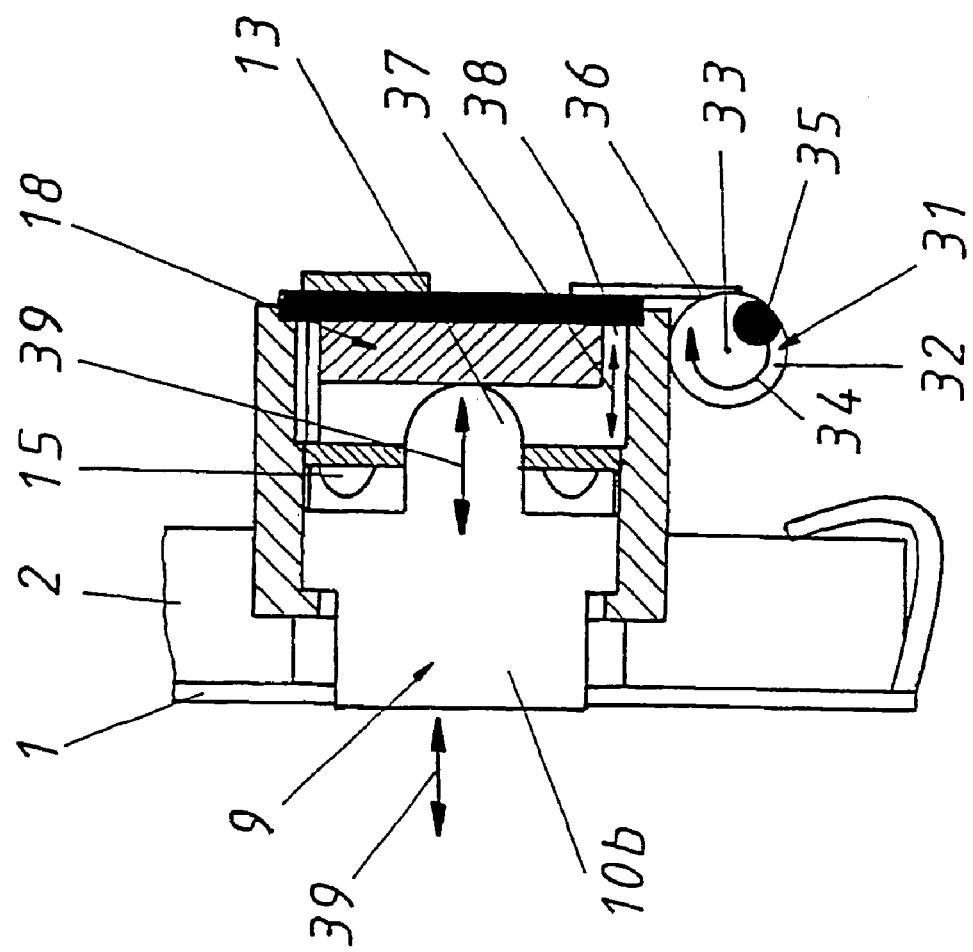
Figure 12:
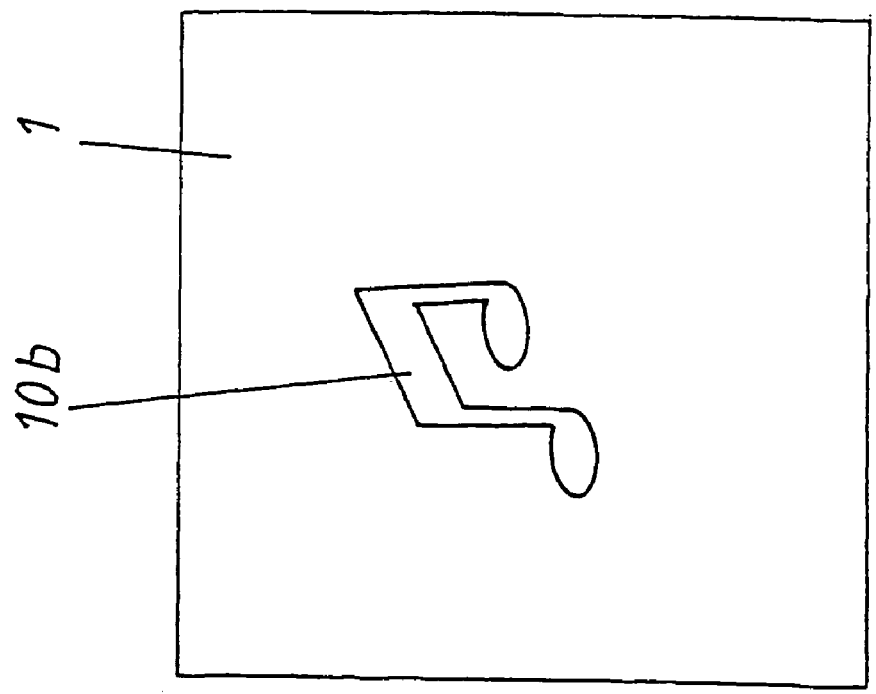

In FIGS. 11 and 12 as a further embodiment a piezo switch is depicted, which conveys a tactile feedback of the switching operation in the form of a vibration.

Here as a further embodiment example according to FIG. 12 the symbol body 10b is developed as a musical note, which intensely illuminated projects from the cover plate 1 and serves directly as the actuation element.

It is evident that only a slight movement tolerance is required for the actuation of the luminous body 9, since here also—as in the embodiment example according to FIGS. 9 and 10—the catch spring 17 is omitted.

Important in this embodiment example is that the vibrator 31 in the depicted embodiment example is developed as a motor which drives a disk 32 about its rotational axis 33 in the direction of arrow 34.

On the disk 32 is disposed an eccenter weight offset eccentrically with respect to the axis of rotation 33.

When a switching operation is triggered, the motor is therewith switched on for example for a switching time of 120 ms, and the rotationally driven disk 32 with the eccenter weight 35 transfers an imbalance via the motor support 36 onto the pins 38 of the synthetic cap 22 of the piezo sensor 18 (see FIG. 2), such that this vibration force is transferred in the direction of arrow 37 onto the synthetic cap which, in turn, vibrates and excites the pressure piece 13, seated force-fittingly thereon, of the luminous body, which now moves in the direction of arrow 39.

Figures 13, 14:
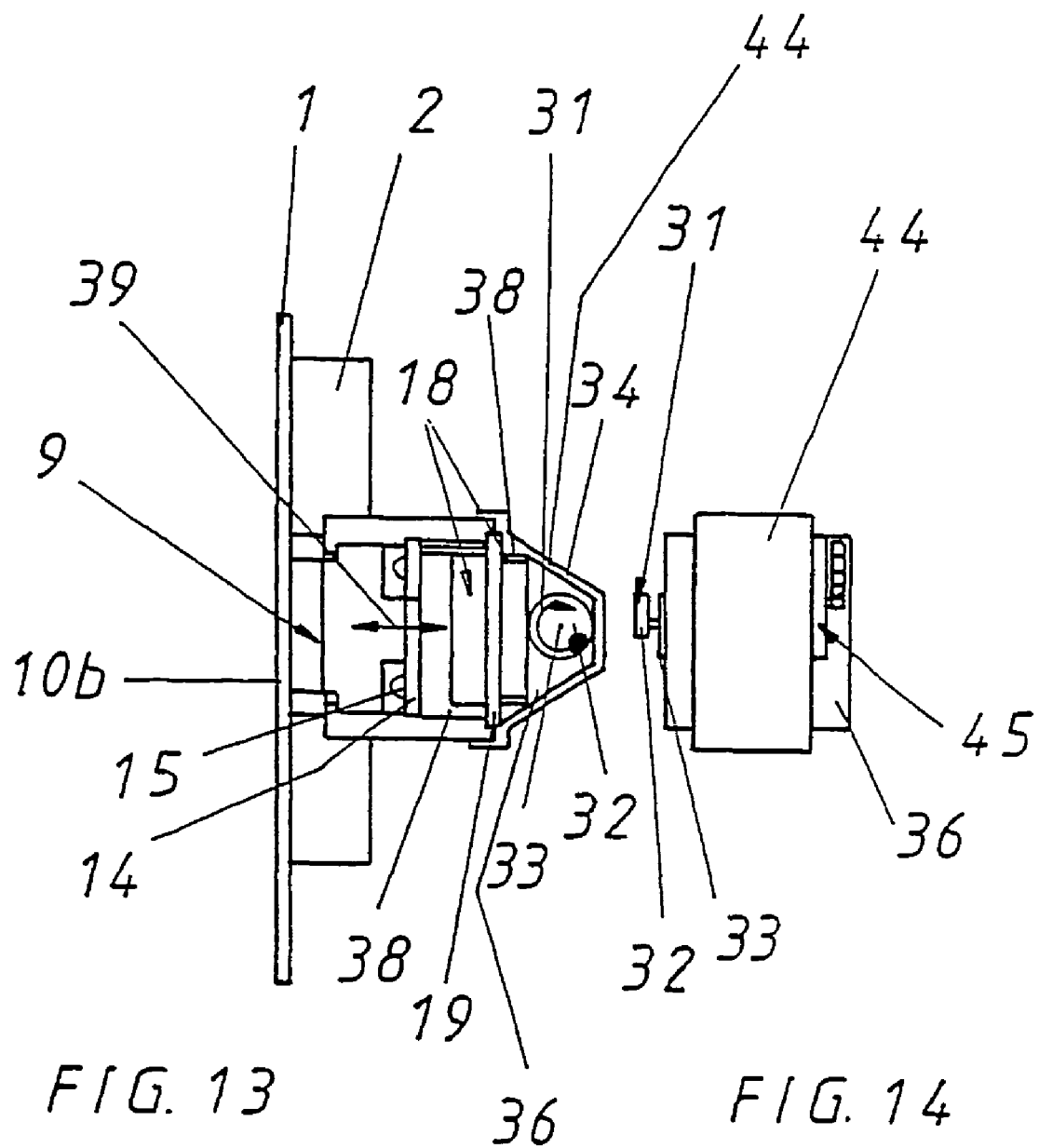

According to FIG. 13 another embodiment of the vibrator 31 and of the mounting brackets of the vibrator 31 on the motor support 36 is shown, and here the connection to the pins 38 via a correspondingly formed band clamp fitting 44 is shown. In this band clamp fitting 44 the motor 45 is embedded via the motor support 36, with the band clamp fitting 44 being stayed on the outer circumference of housing 3. In contrast to FIG. 11, the disk 32 is not centrally supported and has no eccentric eccenter weight 35, but rather the disk 32 itself is supported eccentrically on the rotational axis 33 and consequently forms an imbalance during rotation in the direction of arrow 34 or also in the opposite direction.

In FIG. 14 an additional side view, rotated by 90 relative to FIG. 13, of the vibrator 31 with motor 45 is shown and the eccentric support of the eccenter weight 35 is here clearly visible. If the eccenter weight 35 is rotated about the rotational axis 33, the eccentric vibrations are transferred in the directions of arrow 39 (FIG. 13) onto the motor support 36, and from there onto the band clamp fitting 44 and/or the pins 38 and from there onto the housing 3 and consequently onto the luminous body 9 or the symbol body 10, where the user can pick up the vibrations tactilely with the fingers.

For the remainder the invention provides that the switch is at least partially hermetically encased in order to protect it against the effects of moisture. But in another formation it can also be developed in open structuring.

It is again repeated that the tactile feedback through the disposition of a vibrator 31 is to enjoy independent protection independently of whether or not the switch is illuminated.

The invention claimed is:

1. Electric switch with optical feedback of a switching operation, comprising a cover plate 1 defining front and rear sides and at least one cutout therein defining a predetermined shape representing a desired symbol or icon;
   at least one switching element (18) spaced from said rear side of said cover plate, which can generate a switching signal when actuated,
   an actuation element within a space between said rear side and said switching element and itself being a passive luminous body (9) of an at least translucent material and having at least a portion having a configuration that substantially corresponds to said predetermined shape so that it can at least partially penetrate said cutout proximate to said rear side and be accessible to touch and visible through said cutout from said front side of said cover plate; and active illuminating means actuable by application of contact of said actuation element through said cutout, said passive luminous body (9) being illuminatable via said active illuminating means (15) to cause only said portion of said actuation element to be illuminated and visible through said cutout when observed from said front side of said cover plate.

2. Electric switch as claimed in claim 1, wherein the material of said luminous body (9) transparent.

3. Electric switch as claimed in claim 1, wherein the material of the luminous body (9) is a synthetic material.

4. Electric switch as claimed in claim 1, wherein said actuation element has a surface of said luminous body (9) that defines a symbol body (10).

5. Electric switch as claimed in claim 4, wherein said symbol body (10) is three-dimensional.

6. Electric switch as claimed in claim 1, wherein said cover plate (1) at least in the region of said luminous body (9) is at least translucent and flexible, such that said luminous body (9) can be actuated.

7. Electric switch as claimed in claim 1, wherein said cover plate (1) in the region of the luminous body (9) has a plurality of cutouts (5).

8. Electric switch as claimed in claim 1, wherein said cover plate (1) with respect to the front face (6) has an offset (7) in a direction from said front side towards said rear side as a finger depression.

9. Electric switch as claimed in claim 4, wherein said symbol body (10) extends through said front face (6) of said cover plate (1).

10. Electric switch as claimed in claim 4, wherein at least portions of said luminous body (9) together with said symbol body (10) extend through said front face (6) of said cover plate (1).

11. Electric switch as claimed in claim 9, wherein front face (6) of said cover plate (1) has openings (5) through which extend at least portions of said luminous body (9) or of said symbol body (10).

12. Electric switch as claimed in claim 1, wherein an optical feedback of the switching operation takes place by switching on and off said illuminating means (15).

13. Electric switch as claimed in claim 12, wherein said illuminating means (15) are formed by at least one mono-colored LED or several differently covered LEDs, which are operatable independently of one another.

14. Electric switch as claimed in claim 1, wherein a mechanical feedback of the switching operation is accomplished via a catch spring (17), which is substantially disposed between said luminous body (9) and said switching element (18).

15. Electric switch as claimed in claim 1, wherein a mechanical feedback of the switching operation takes place via a vibrator (31), which is actuated due to the initiated switching operation and which outputs a vibrating movement onto said luminous body (9).

16. Electric switch as claimed in claim 15, wherein said vibrator (31) comprises a miniature motor (45).

17. Electric switch as claimed in claim 16, wherein said miniature motor (45) drives a disk (32), which is supported eccentrically on a rotational axis (33), or which disk (32) is supported centrally and comprises an eccentric weight (35) and consequently the vibrations of said vibrator (31) are conducted via a motor support (36) onto said luminous body.

18. Electric switch as claimed in claim 15, wherein said vibrator 31 comprises a hammer break or electromagnet or ultrasound element.

19. Electric switch as claimed in claim 15, wherein said vibrator (31) comprises a piezo sensor that includes an active piezo crystal.

20. Electric switch as claimed in claim 15, wherein during the formation of the electric switch, said vibrator (31) comprises at least one piezo sensor (18) of said piezo switch.

21. Electric switch, in particular piezo switch, with optical and/or mechanical feedback of the switching operation, comprising, beneath a cover plate (1) provided with a cutout, defining a predetermined shape representing a desired symbol or icon, at least one switching element (18), which can be actuated by means of a portion of an actuation element, said cutout and portion being configured so that said portion can at least partially penetrate through said cutout and be accessible to touch through the cutout in said cover plate, whereby a switching signal is generated and conducted out via electric contacts, wherein a mechanical feedback of the switching operation takes place via a vibrator (31), which is operated due to the initiated switching operation by means of application of touch to said portion through said cutout and which outputs a vibrating movement to the actuation element, with the vibrator (31) being developed as a rotating miniature motor (45) or as a hammer break with electromagnet or through at least one piezo crystal (23) of the piezo switch itself when developing the electric switch as a piezo switch.

22. Electric switch as claimed in claim 21, wherein said miniature motor (45) drives a disk (32), which is supported eccentrically on a rotational axis (33), or which disk is supported centrally and comprises an eccentric weight (35), and consequently the vibrations of the vibrator (31) are conducted via the motor support (36) onto the actuation element formed as a luminous body.

23. Electric switch as claimed in claim 21, wherein an additional vibrator (31) is used as an ultrasound element and/or as a piezo sensor, which includes an active piezo crystal.

24. Electric switch as claimed in claim 22, wherein an optical feedback of the switching operation takes place by switching on or off the illuminating means (15).

25. Electric switch as claim in claim 24, wherein said illuminating means (15) includes at least one mono-colored LED or differently colored LEDs that can be driven individually.

26. Electric switch as claimed in claim 1, wherein an electric switch includes a piezo switch, which comprises a switching element (18) a piezo sensor with a piezo crystal (23).

27. Electric switch as claimed in claim 21, wherein said electric switch includes a piezo switch, which comprises a switching element (18) a piezo sensor with a piezo crystal (23).

28. Electric switch comprising a cover plate (1), including at least one cutout therein having a predetermined configuration, at least one switching element (18) that can be actuated by means of an actuating element proximate to said cutout (5) in said cover plate (1), to be accessible to touch from outside the switch, thus generating a switching signal that is conducted out via electrical contacts, said actuating element being configured as a passive luminous element (9) of light transmitting material and capable of being illuminated;

active lighting means (15), said luminous element (9) being disposed between the cover plate and said active lighting means and having at least a portion thereof configured as a three-dimensional symbol block (10) with symbol webs (40) defining a shape of a symbol substantially corresponding to said predetermined configuration of said cutout (5) in said cover plate (1) such that only said symbol webs (40) of said symbol block (10) extend at least partially into said at least one opening in said cover plate and remaining parts of said symbol block (10) are concealed by said cover plate (1), whereby finger pressure on said symbol block (10) accessible through said at least one cutout actuates said active lighting means and light is transmitted through said passive luminous element (9) and rendered visible through said symbol block (10) and said at least one cutout.

29. Electric switch according to claim 28, wherein said luminous element (9) is made of plastic material.

30. Electric switch according to claim 28, wherein said cover plate (1) is made of a material selected from a group consisting of wood, metal, plastic material or glass.

31. Electric switch according to claim 28, wherein its cover plate (1) has a back offset (7) set back from a front face (6) as a finger recess in the region of the cutout.

32. Electric switch according to claim 28, wherein said symbol block (10) is visible to the user only from the front, that is, from the viewing side of the cover plate.

33. Electric switch according to claim 28, wherein said switch is at least partially hermetically sealed to protect it from the action of moisture.

34. Electric switch according to claim 28, wherein said symbol block (10) is machined out of the material of the luminous element (9) as one piece, or is formed as a separate element from said luminous element (9) and is affixed thereto.

35. Electric switch according to claim 34, wherein said symbol block (10) is formed as a separate element from said luminous element (9) and is glued or injection-molded therein.

36. Electric switch according to claim 28, wherein a visual feedback of the switching operation is given by the switching on or off of said lighting means.

37. Electric switch according to claim 36, wherein said lighting means (15) consists of at lest one single-color LED or a plurality of LEDs of various colors that can be operated independently of each other.

38. Electric switch according to claim 28, wherein mechanical feedback of the switching operation is provided by a snap spring (17) that is arranged substantially between the luminous element (9) and the switching element (18).

39. Electric switch according to claim 28, wherein mechanical feedback of the switching operation is provided by a vibrator (31) that is actuated as a result of the switching position that has been initiated and imparts a vibrating motion to the luminous element (9).

40. Electric switch according to claim 39, wherein said vibrator (31) is configured as a miniature motor (45).

41. Electric switch according to claim 40, wherein said miniature motor 45 drives a disc (32) that is mounted eccentrically on a rotational axis (33) or which disc (32) is mounted centrally and has an eccentric weight (35), so that the vibrations of the vibrator (31) are transmitted through the motor mounting (36) to the luminous element (3).

42. Electric switch according to claim 39, wherein said vibrator (31) is configured as a hammer interrupter or electromagnet or ultrasonic element.

43. Electric switch according to claim 39, wherein said vibrator (31) is formed by a piezoelectric sensor configured as an active piezoelectric crystal.

44. Electric switch according to claim 39, wherein if the electric switch is configured as a piezoelectric switch, the vibrator (31) is formed by a least one piezoelectric sensor (18) of the piezoelectric switch.

\* \* \* \* \*